United States Patent [19]
Tseng

[11] Patent Number: 5,756,384
[45] Date of Patent: May 26, 1998

[54] METHOD OF FABRICATING AN EPROM CELL WITH A HIGH COUPLING RATIO

[75] Inventor: Horng-Huei Tseng, Hsinchu, Taiwan

[73] Assignee: Vanguard International Semiconductor Corporation, Hsinchu, Taiwan

[21] Appl. No.: 859,565

[22] Filed: May 20, 1997

[51] Int. Cl.[6] .................................................. H01L 21/8247
[52] U.S. Cl. .......................... 438/257; 438/593; 438/594; 438/596
[58] Field of Search ..................... 438/233, 593, 438/594, 257, 595, 596

[56] References Cited

U.S. PATENT DOCUMENTS

| | | | |
|---|---|---|---|
| 5,053,849 | 10/1991 | Izawa et al. | 438/593 |
| 5,498,560 | 3/1996 | Sharma et al. | 438/593 |
| 5,543,339 | 8/1996 | Roth et al. | 438/593 |
| 5,559,049 | 9/1996 | Cho | 438/593 |
| 5,567,637 | 10/1996 | Hirota | 438/593 |

Primary Examiner—John Niebling
Assistant Examiner—Richard A. Booth
Attorney, Agent, or Firm—Christensen, O'Connor, Johnson & Kindness PLLC

[57] ABSTRACT

A method of forming an EPROM with a high capacitive coupling ratio is disclosed. The method includes forming a tunnel oxide layer on the substrate. A first polysilicon layer is then formed over the tunnel oxide layer. A dielectric layer is deposited on the first polysilicon layer. Then, the layers are patterned and etch to form a stacked structure. A lateral etching is performed to etch portions of the first polysilicon layer. Next, a second polysilicon layer is formed along the surface of the first polysilicon layer, the tunnel oxide and the dielectric layer. An anisotropic etching process is carried out to anisotropically etch the second polysilicon layer. The dielectric layer is then removed by wet etching. Subsequently, a inter-poly dielectric layer is formed along the surface of first polysilicon layer and the second polysilicon layer. A third polysilicon layer is then formed along the surface of the inter-poly dielectric layer. Finally, an etching process is used using a photoresist as an etching mask to etch the inter-poly dielectric layer and the third polysilicon layer.

14 Claims, 3 Drawing Sheets

METHOD OF FABRICATING AN EPROM CELL WITH A HIGH COUPLING RATIO

FIELD OF THE INVENTION

The present invention relates to an electrically erasable programmable read only memory (EEPROM) cell and a flash erasable programmable read only memory (EPROM) cell and, more particularly, to a cell structure with a high gate coupling ratio.

BACKGROUND OF THE INVENTION

The EEPROM and the flash EPROM are well known in the semiconductor art. The EEPROM is erased and programmed using electrical signals. The basic memory cell consists of an access transistor and a double polysilicon storage cell with a floating polysilicon gate isolated in silicon dioxide capacitive coupled to a second polysilicon control gate which is stacked above it. EPROM circuits include a matrix of EPROM devices, each of with which stores a bit of information, and a plurality of peripheral transistor devices. Peripheral transistors are required for such functions as row decode and column decode of the EPROM matrix, latches and drivers.

Currently, the basic technique used to perform the erase and program operations in the EEPROM is referred to as Fowler-Nordheim tunneling. Fowler-Nordheim tunneling is thought to be cold electron tunneling through the energy barrier at a silicon-silicon dioxide interface into the oxide conduction band. Many memory manufacturers choose a thin oxide floating gate process to make an EEPROM. The floating gate oxide is typically 50 nm thick, and the inter-poly oxide is about 50 nm thick.

EEPROMs typically operate in a program mode, an erase mode, and a read mode. In the program mode, the source region is held at a high positive voltage and the control gate is held at a negative voltage. Consequently, the EEPROM cell is programmed by Fowler-Nordheim tunneling of electrons through the thin gate oxide between the floating gate and the source region of the cell. Electrons tunneling from the floating gate to the source region leave the floating gate relatively more positively charged. The positively charged floating gate shifts the threshold voltage of the memory cell in the negative direction so that in the read mode the transistor will be 'on'. The programmed state corresponds to a logical '0' state in the cell (see SEMICONDUCTOR MEMORIES: A Handbook of Design, Manufacture, and Application, B. Prince, Chapter 12).

In the erase mode, the control gate is held at high positive voltage while the drain region is grounded (i.e., coupled to a source of ground potential). Electrons tunnel through to the floating gate and the threshold voltage shifts in the positive direction so that in the read mode the transistor will be 'off'. The erased state corresponds to a logical '1' stored in the cell. In the read mode, the control gate is held at the integrated circuit supply voltage ($V_{cc}$), which would be lower than the threshold voltage of the EEPROM cell after being erased, but higher than the threshold voltage of the EEPROM cell after being programmed.

EPROMs dependent upon avalanche charge injection or hot injection onto a floating gate has evolved. In EPROMs, under the influence of a high applied drain voltage, charge collects on the floating gate where it is trapped by the surrounding oxide insulator. The cell is erased by ultraviolet light which increases the energy of the floating gate electrons enabling them to jump the energy barrier and dissipated.

As is known in the art, the trend of the semiconductor industry is to increase the packing density of devices and scale down the size of the devices. Thus, the capacitive coupling ratio of semiconductor devices, such as EPROM and EEPROM, are decreased due to the decreased size of the devices. Unfortunately, it is difficult to efficiently fabricate EEPROM's or flash EPROMs with a high capacitive coupling ratio.

SUMMARY OF THE INVENTION

A method of forming an EPROM cell on a wafer is disclosed. The method comprises: forming a tunnel oxide layer on said wafer; forming a first polysilicon layer on said tunnel oxide layer for serving as a portion of a floating gate of said EPROM; forming a first dielectric layer on said first polysilicon layer; patterning and etching said first dielectric layer and said first polysilicon layer to form a stacked structure; performing a lateral etching to etch said first polysilicon layer, thereby narrowing the width of said first polysilicon layer relative to said first dielectric layer; forming a second polysilicon layer along the surface of said first polysilicon layer and said first dielectric layer for serving as a portion of said floating gate; anisotropically etching said second polysilicon layer, thereby exposing said first dielectric layer; removing said first dielectric layer, thereby forming a structure consisting of said first polysilicon layer and said second polysilicon layer; forming a second dielectric layer atop said first polysilicon layer and said second polysilicon layer; forming a third polysilicon layer along the surface of said second dielectric layer; and patterning and etching said third polysilicon layer and said second dielectric layer to define a control gate of said EPROM.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

An EEPROM cell or a flash EPROM cell is disclosed herein to increase the capacitive coupling ratio of the cell. As is known in the art, one of the ways for upgrading the capacitive coupling ratio of the cell is to increase the area of a floating gate formed in the cell. Thus, the purpose of the present invention is to increase the area of the floating gate, thereby raising the capacitive coupling ratio of the cell.

Figure 1:
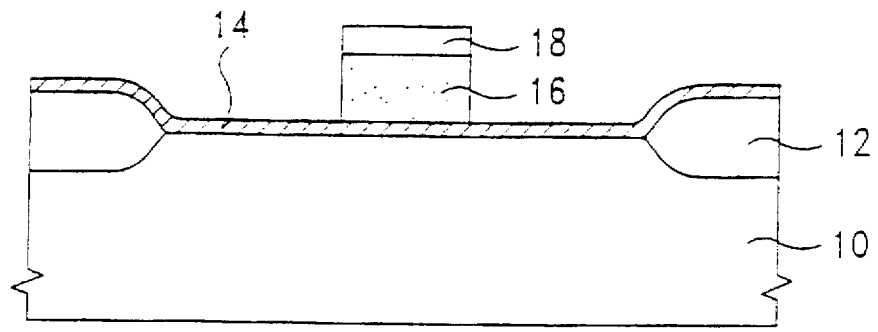
FIG. 1 is a cross section view of a semiconductor wafer illustrating the step of forming a first polysilicon layer and a dielectric layer in accordance with the present invention.

As will be seen below, many techniques well known in the art can be used to form one embodiment of an EPROM cell in accordance with the present invention. Referring to FIG. 1, in this embodiment, a single crystal substrate 10 with a <100> crystallographic orientation is used. First, thick field oxide regions (FOX) 12 are formed for the purpose of electrical isolation between active regions. The FOX 12 regions are created via photolithography and dry etching steps to etch a silicon nitride-silicon dioxide composite layer. After the photoresist is removed and wet cleaned, a thermal oxidation in an oxygen ambient is used to form the FOX 12 regions, to a thickness about 4000–6000 angstroms.

A tunneling oxide layer 14 is then formed on the substrate 10 by using an oxygen ambient, at a temperature between about 85° to 1000° C. Typically, the thickness of the tunnel oxide is in the range of 50–200 angstroms. It is appreciated that other methods of forming the oxide, such as chemical vapor deposition (CVD), can also be used.

A first polysilicon layer 16 is then formed over the tunneling oxide layer 14 and the field oxide regions 12. The first polysilicon layer 16 is formed using conventional CVD. It can be appreciated that other methods of depositing the polysilicon layer 16 can also be used. The thickness of the first polysilicon layer 16 is optimally 2000–4000 angstroms. In this embodiment, the first polysilicon layer 16 is chosen from doped polysilicon or in-situ doped polysilicon. Further, the first polysilicon layer 16 is utilized to define a portion of a floating gate of the EPROM cell.

Subsequently, a dielectric layer 18 is deposited on the first polysilicon layer 16. Preferably, CVD-oxide or silicon nitride can be used to act the dielectric layer 18. In this case, the dielectric layer 18 is formed to have a thickness of about 500–1500 angstroms. Furthermore, the first polysilicon layer 16 has highly selective etching relative to the dielectric layer 18.

Next, a photoresist is patterned on the dielectric layer 18 to cover a portion of the dielectric layer 18. An etching process is used to remove portions of the dielectric layer 18 and the first polysilicon layer 16 that are left uncovered by the photoresist, thereby forming a polysilicon/dielectric composition stacked layer 16, 18 on the tunneling oxide 14. Next, the photoresist is stripped away.

Figure 2:
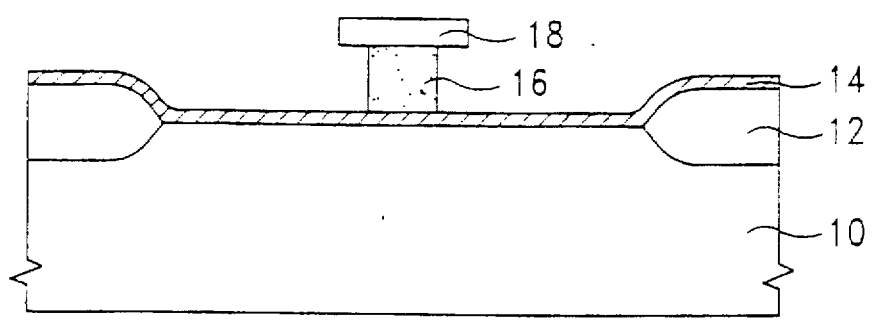
FIG. 2 is a cross section view of a semiconductor wafer illustrating the step of using a lateral etching to etch the first polysilicon layer in accordance with the present invention.

Turning to FIG. 2, a lateral etching is performed using the dielectric layer 18 as a mask to attack the first polysilicon layer 16. By controlling the etching time, the side portions of first polysilicon layer are removed by the etching. Therefore, the width of the first polysilicon layer 16 is narrower than the dielectric layer 18. In a preferred embodiment, a highly selective etching is utilized in the step. More specifically, the etch of the etching step is chemical dry etching plasma process using $SF_6$ as the reaction gas, so that the etchant almost only etches the first polysilicon layer 16.

Figure 3:
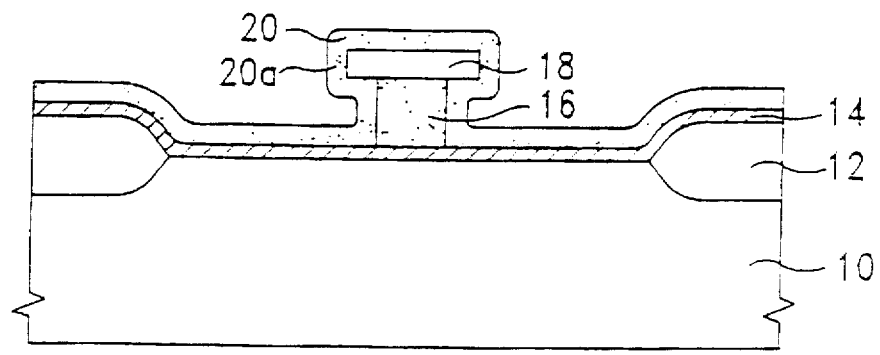
FIG. 3 is a cross section view of a semiconductor wafer illustrating the step of forming a second polysilicon layer in accordance with the present invention.

Next, referring to FIG. 3, a second polysilicon layer 20 is conformally formed along the surface of the first polysilicon layer 16, the tunneling oxide 14 and the dielectric layer 18. The thickness of the second polysilicon layer 20 can range from 300 angstroms to 1500 angstroms. In the preferred embodiment, the second polysilicon layer 20 is formed of in-situ doped polysilicon, which is deposited by CVD. Overhang portions 20a of the second polysilicon layer 20 are generated at the edge of the dielectric layer 18.

Figure 4:
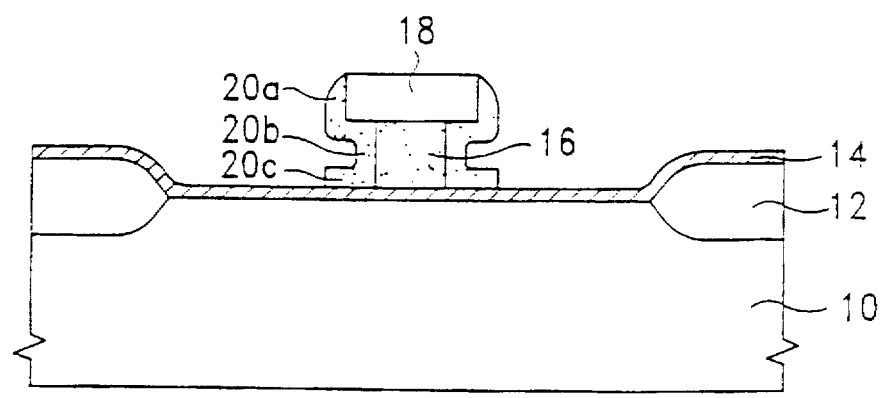
FIG. 4 is a cross section view of a semiconductor wafer illustrating the step of performing an anisotropic etching process to anisotropically etch the second polysilicon layer in accordance with the present invention.

Next, as shown in FIG. 4, an anisotropic etching process is then carried out to anisotropically etch the second polysilicon layer 20. The dielectric layer 18 is exposed by the etching. Further, overhang portions 20a are left intact after the etching because the etching is anisotropic. Simultaneously, polysilicon sidewall spacers 20b are formed on the side wall of the first polysilicon layer 16 and the portions 20c of the polysilicon layer 20 also remain. That is because that the overhang portions 20a are used as a mask to prevent the portions 20b, 20c from etching. In this case, a reactive ion etching is used.

Figure 5:
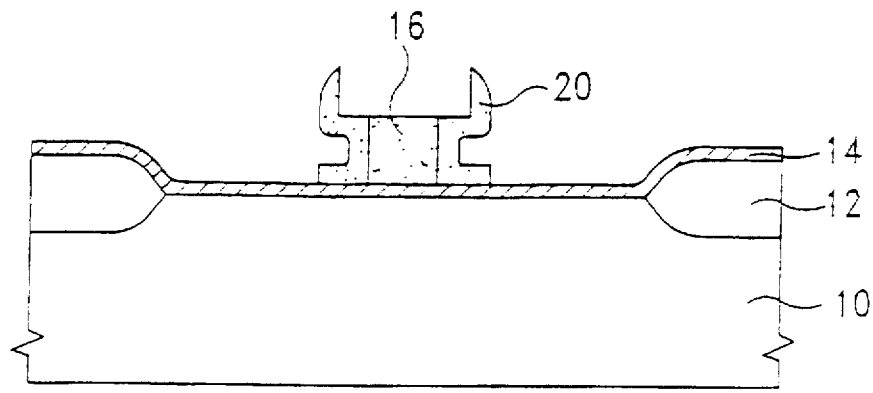
FIG. 5 is a cross section view of a semiconductor wafer illustrating the step of removing the dielectric layer on the gate oxide in accordance with the present invention.

Referring to FIG. 5, the dielectric layer 18 is removed by wet etching. In the preferred embodiment, the dielectric layer 18 is composed of silicon nitride or doped oxide which has high etching rate in HF solution. The resulting structure consisting of first and second polysilicon layers 16, 20 serves as a floating gate of the EPROM, which has larger surface area than conventional floating gates.

Figure 6:
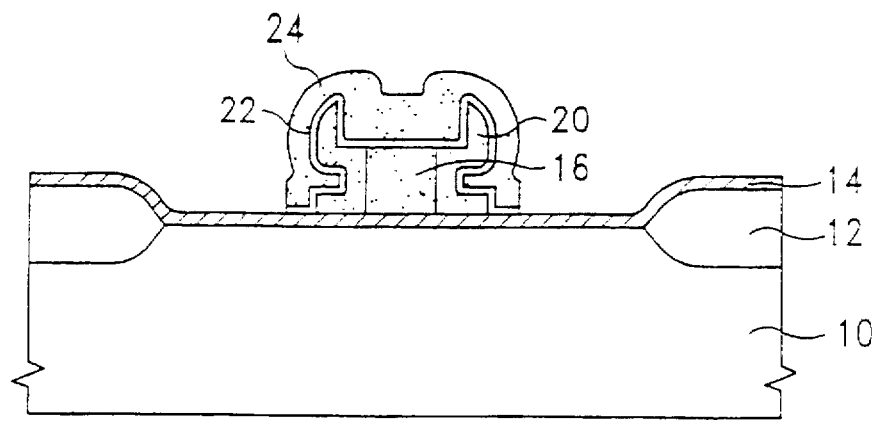
FIG. 6 is a cross section view of a semiconductor wafer illustrating the step of forming a third polysilicon layer and a inter-poly dielectric layer in accordance with the present invention.

Turning to FIG. 6, a inter-poly dielectric layer 22 is conformally formed along the surface of first polysilicon layer 16 and the second polysilicon layer 20 by CVD. The thickness of the inter-poly dielectric layer 22 is about 50 to 200 angstroms and composed of ONO (oxide/nitride/oxide) or NO (nitride/oxide). Subsequently, a third polysilicon layer 24 is formed along the surface of the inter-poly dielectric layer 22 for acting as the control gate of the cell using CVD. Similarly, the third polysilicon layer is in-situ polysilicon. Finally, a masking and etching process is used to etch the inter-poly dielectric layer 22 and the third polysilicon layer 24. Thus, an EPROM with larger capacitive coupling ratio is formed.

As can be understood by those skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming an EPROM cell on a wafer, said method comprising:

forming a tunnel oxide layer on said wafer;

forming a first polysilicon layer on said tunnel oxide layer for serving as a portion of a floating gate of said EPROM;

forming a first dielectric layer on said first polysilicon layer;

patterning and etching said first dielectric layer and said first polysilicon layer to form a stacked structure; first polysilicon layer to form a stacked structure;

performing a lateral etching to etch said first polysilicon layer, thereby narrowing the width of said first polysilicon layer relative to said first dielectric layer;

forming a second polysilicon layer along the surface of said first polysilicon layer and said first dielectric layer for serving as a portion of said floating gate;

anisotropically etching said second polysilicon layer, thereby exposing said first dielectric layer;

removing said first dielectric layer, thereby forming a structure consisting of said first polysilicon layer and said second polysilicon layer;

forming a second dielectric layer atop said first polysilicon layer and said second polysilicon layer;

forming a third polysilicon layer along the surface of said second dielectric layer; and patterning and etching said third polysilicon layer and said second dielectric layer to define a control gate of said EPROM.

2. The method of claim 1, wherein said tunneling oxide is formed to have a thickness of about 50–200 angstroms.

3. The method of claim 1, wherein said first polysilicon layer has a thickness of about 2000–4000 angstroms.

4. The method of claim 1, wherein said first dielectric layer has a thickness of about 500–1500 angstroms.

5. The method of claim 4, wherein said first dielectric layer is composed of silicon nitride.

6. The method of claim 4, wherein said first dielectric layer is composed of oxide.

7. The method of claim 1, wherein said lateral etching is done by chemical dry etching plasma process using $SF_6$ as a reaction gas.

8. The method of claim 1, wherein said second polysilicon layer comprises a thickness of about 300–1500 angstroms.

9. The method of claim 1, wherein said anisotropic etching is performed by using reactive ion etching.

10. The method of claim 1, wherein said second dielectric layer comprises ONO.

11. The method of claim 1, wherein said second dielectric layer comprises NO.

12. The method of claim 1, wherein said second dielectric layer has a thickness of about 50–200 angstroms.

13. A method of forming a floating gate of an EPROM cell on a semiconductor substrate, said method comprising the steps of:

forming a tunnel oxide layer of said semiconductor substrate;

forming a stacked structure on said tunnel oxide layer, said stacked structure comprising a polysilicon portion atop said substrate and a dielectric portion atop said polysilicon portion;

removing a portion of said polysilicon portion so that said dielectric portion overhangs said polysilicon portion;

conformally forming a second polysilicon layer over said dielectric portion, said polysilicon portion and said tunnel oxide;

anisotropically etching said second polysilicon layer until said dielectric portion is exposed;

removing said dielectric portion;

conformally forming an inter-poly dielectric layer atop said polysilicon portion and said second polysilicon; and conformally forming a third polysilicon layer atop said inter-poly dielectric layer.

14. The method of claim 13 further including the step of patterning and etching said inter-poly dielectric layer and said third polysilicon layer to form a control gate.

* * * * *